United States Patent [19]
Adam

[11] 4,451,744
[45] May 29, 1984

[54] MONOLITHIC INTEGRATED REFERENCE VOLTAGE SOURCE

[75] Inventor: Fritz G. Adam, Freiburg, Fed. Rep. of Germany

[73] Assignee: ITT Industries, Inc., New York, N.Y.

[21] Appl. No.: 349,888

[22] Filed: Feb. 18, 1982

[30] Foreign Application Priority Data

Mar. 7, 1981 [DE] Fed. Rep. of Germany ....... 3108726

[51] Int. Cl.$^3$ .......................... G05F 3/16; H01L 29/78
[52] U.S. Cl. .................................... 307/297; 307/304; 357/23
[58] Field of Search ............... 307/297, 304, 491, 310; 323/313, 314; 357/23 D

[56] References Cited

U.S. PATENT DOCUMENTS

| | | | |
|---|---|---|---|
| 3,832,644 | 8/1974 | Nagata et al. | 323/313 X |
| 4,052,229 | 10/1977 | Pashley | 357/23 D X |
| 4,078,947 | 3/1978 | Johnson et al. | 357/23 D X |
| 4,224,539 | 9/1980 | Musa et al. | 307/297 X |
| 4,281,261 | 7/1981 | Adam | 307/297 X |
| 4,301,380 | 11/1981 | Thomas | 307/297 X |
| 4,365,263 | 12/1982 | Kawagoe | 357/23 D X |

FOREIGN PATENT DOCUMENTS

112618 8/1980 Japan .................................. 323/313

OTHER PUBLICATIONS

Dennard et al, "Minimum Defect Propagation, Enhancement/Depletion Process", *IBM Tech. Discl. Bull.;* vol. 16, No. 5, pp. 1530–153; 10/73.

Runge, "Threshold Voltage Shift of MOS Transistors by Ion Implantation", *Electronic Engineering;* pp. 41–43; 1/76.

*Primary Examiner*—Larry N. Anagnos
*Attorney, Agent, or Firm*—James B. Raden; Donald J. Lenkszus

[57] ABSTRACT

The invention discloses a monolithic integrated reference voltage source consisting of a source-drain series arrangement of a depletion-type n-channel MOSFET connected to the supply potential and of an enhancement-type n-channel MOSFET connected to a reference potential. The gate electrode of the depletion-type transistor is connected to the reference potential, while the reference voltage is taken off the point connecting the two transistors, to which point the gate electrode of the enhancement-type transistor is connected. When certain manufacturing requirements are observed as regards the gate oxide layer thickness, the substrate doping and the ratio r of the width-to-length ratio (W = width and L = length of the conducting channel), the circuit displays a very small temperature dependence of the reference voltage and a small surface requirement.

1 Claim, 3 Drawing Figures

MONOLITHIC INTEGRATED REFERENCE VOLTAGE SOURCE

BACKGROUND OF THE INVENTION

1. Field of the Invention

The invention relates to a monolithic integrated reference voltage source.

2. Description of the Prior Art

A reference voltage source is disclosed in "IEEE Journal of Solid-State Circuits", Vol. SC 13, No. 6 (December, 1978) pp 767 to 774 and "1978 IEEE International Solid-State Circuits Conference, Digest of Technical Papers", pp. 178 and 179. This reference voltage source is known to make use of the phenomenon according to which the difference between the threshold voltages of a depletion-type n-channel MOSFET and an enhancement-type n-channel MOSFET, in a first approximation, is independent of the temperature and, in an easily controllable and reproducible manner is chiefly dependent upon the implanted charge. Therefore, use is made of this phenomenon for achieving a temperature compensation in monolithic integrated circuits. In so doing, the drain potentials of the two MOSFETs arranged in parallel-connected branches, are applied to the two inputs of a differential amplifier.

SUMMARY OF THE INVENTION

The monolithic integrated reference voltage source according to the invention, however, departs from the above-mentioned parallel-connection principle. It was found that when certain manufacturing requirements are observed with respect to the gate oxide layer thickness, the substrate doping and the ratio r of the width-to-length ratios (W=width and L=length of the conducting channel) there is not only obtained a comparatively very good temperature independence of the reference voltage but, in certain source-drain series arrangements of a depletion-type n-channel MOSFET and of an enhancement-type n-channel MOSFET, it is also possible to realize a monolithic integrated reference voltage source employing a small number of MOSFETs and consequently, having a small surface requirement, with the electrical properties thereof being within wide limits extensively independent of the aforementioned manufacture parameters.

It is the object of the invention, therefore, to provide a monolithic integrated reference voltage source comprising a drain-source series arrangement of a first depletion-type n-channel MOSFET connected between a supply potential and a reference potential, and lying on the supply-potential side, as well as a second enhancement-type n-channel MOSFET lying on the reference-potential side. The voltage source must have as small as possible temperature dependence within the range from about −20° C. to 80° C., with the reproducible manufacture thereof being extensively independent of the technologically required variations concerning the thickness of the gate oxide, the substrate doping and the W/L ratios of the MOSFETs.

According to the invention, this object is achieved by connecting the gate electrode of said first MOSFET to the source electrode of said second MOSFET which is connected to a reference potential which may be ground. The gate electrode of said second MOSFET being connected to its drain electrode which is, in turn, connected to the source electrode of the first MOSFET and provides the reference voltage. The thickness of the gate oxide layers of said two MOSFETs is dimensioned to range between 0.060 and 0.066 $\mu$m, and the substrate doping of the p-doped substrate below the gate oxide of said second MOSFET is chosen to range between 5 and $7 \cdot 10^{14}$ cm$^{-3}$, and that $0.75 \cdot 10^{12}$ to $1.25 \cdot 10^{12}$ cm$^{-2}$ donators are implanted into the substrate surface below the gate oxide of said first MOSFET.

The ratio $r_{12}=(W/L)_1/(W/L)_2$ of said two MOSFETs ranges between 1.10 and 1.140, with respectively W indicating the width and L indicating the length of the conducting channels of the involved MOSFETs.

Accordingly, in the monolithic integrated reference voltage source as proposed by the invention there is used a particular series arrangement of insulated-gate field-effect transistors having gate oxide layers of silicon oxide (MOSFETs), with the gate electrode of a first MOSFET being connected to the source electrode of the second MOSFET of the series arrangement, or to the reference potential respectively. Extensive investigations have shown that just this series arrangement is particularly well suitable for solving the abovementioned problem.

DESCRIPTION OF THE INVENTION

Figure 1:
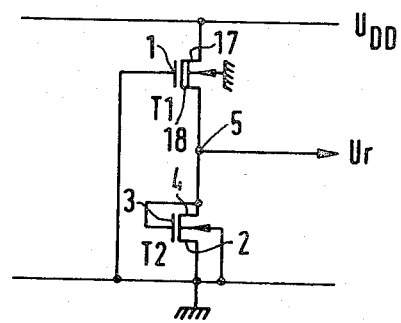
FIG. 1 shows the basic circuit of a monolithic integrated reference voltage source according to the invention.

FIG. 1 shows a drain-source series arrangement of an n-channel depletion-type MOSFET T1, whose drain electrode 17 is connected to the supply voltage $U_{DD}$, with an n-channel enhancement-type MOSFET T2 whose source electrode 2 is connected to a reference potential. The gate electrode 1 of the MOSFET T1 is connected to the reference potential, and the gate electrode 3 of the MOSFET T2 is connected to the connecting point 5 of the drain-source series arrangement to which the source electrode 18 of MOSFET T1 is also connected. The substrate of the two MOSFETs T1 and T2 is connected to the reference point while the reference voltage Ur is taken off the common connecting point 5.

Figure 2:
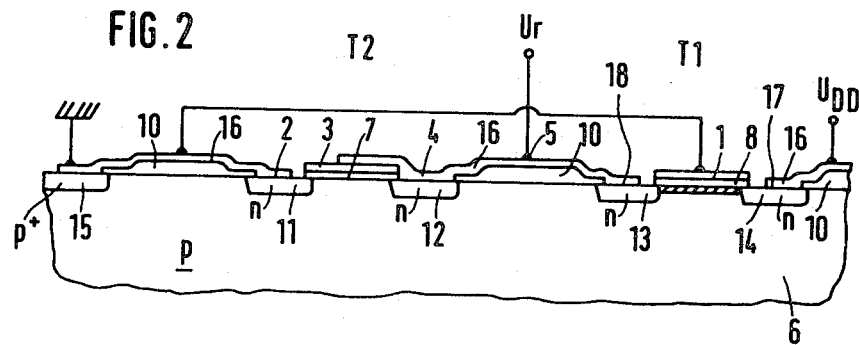
FIG. 2 is a partial sectional view, showing the monolithic integrated reference voltage source according to the invention corresponding to the basic circuit as shown in FIG. 1.

FIG. 2 shows the integration of the reference voltage source according to FIG. 1 which is realized in accordance with silicon gate technology which is generally known among experts. In so doing, surface areas of a silicon substrate 6 having a thick oxide layer 10 are exposed so that MOSFETs T1 and T2 may be formed. The acceptor concentration of the substrate 6 is to be chosen to range between $5 \cdot 10^{14}$ cm$^{-3}$ and $7 \cdot 10^{14}$ cm$^{-3}$.

The side of the surface provided with the thick oxide layer 10 is coated with a layer masking against an ion implantation, preferably consisting of a photoresist. In this photoresist masking layer which is not shown in the drawing, there is produced an opening at the area of the silicon gate electrode of the MOSFET T1 which is still to be manufactured. The masked surface side is now subjected to a donator implantation process until $0.75 \cdot 10^{12}$ to $1.25 \cdot 10^{12}$ cm$^{-2}$ are implanted into the exposed semiconductor surface of the MOSFET T1.

Upon removal of the masking layer, the exposed semiconductor surface within the opening of the thick oxide layer 10, is filled with an oxide layer to be dimensioned to have a thickness ranging between 0.060 and 0.066 μm. In accordance with the known silicon gate technology, a polycrystalline silicon layer is now deposited from the gaseous phase, which may be doped with donators in a concentration of approximately $10^{20}$ $cm^{-3}$.

Subsequently thereto, the gate electrodes 1 and 3 with their adjoining gate oxide layers 7 and 8, by employing a photolithographic etching process, and by exposing the semiconductor surface, are exposed in the areas of the zones 11 through 14 to be diffused, and an n-doping planar diffusion process is carried out, in the course of which the gate electrodes 1 and 3 together with their adjoining gate oxide layers 7 and 8 act as a diffusion mask.

By employing a special p-doping planar diffusion process, it is possible to fabricate the contacting zone 15 to which the reference potential of the substrate 6 is applied, and to which the gate electrode 1 of the MOSFET T1 is to be connected, as is illustrated in FIG. 2. For this purpose, and for manufacturing the further connections as shown in FIG. 1, the conductor leads 16 are deposited, of which one, for example, contacts the source electrode of the MOSFET T2 with the substrate 6.

For solving the problem underlying the invention, it is moreover necessary to observe a special ratio $r_{12}$ of the W/L ratios of the two MOSFETs T1 and T2. This ratio $r_{12}$ shall be lying between 1.10 and 1.40.

In fabricating integrated reference voltage sources according to the invention, a certain variation of the r-values, of course, cannot be avoided, which has effects upon certain, though small variations of the reference voltage Ur.

Figure 3:
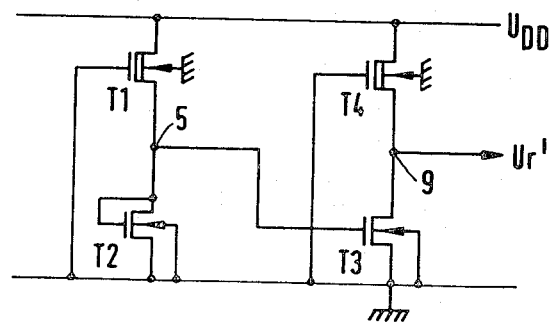
FIG. 3 shows the circuit of a further embodiment of the basic circuit shown in FIG. 1.

FIG. 3 shows the circuit of a further embodiment of the monolithic integrated reference voltage source according to the invention. On principle, the circuit according to FIG. 3 represents a series arrangement of two reference voltage sources according to FIG. 1, with the reference voltage Ur of the first reference source containing the MOSFETs T1 and T2 being connected to the gate electrode of a third n-channel enhancement-type MOSFET T3 of a further drain-source series arrangement of this MOSFET T3 with a fourth n-channel depletion-type MOSFET T4 connected on the supply-voltage side. The gate electrode of this last-mentioned MOSFET T4 is connected in the same way as that of the MOSFET T1 of the first series arrangement T1 and T2, to the reference voltage. Of course, there is missing a corresponding connection of the gate electrode of the third enhancement-type MOSFET T3 lying on the reference voltage side, to the connecting point 9 of the series arrangement, from which a further reference voltage Ur' is taken off.

The reference voltage source according to FIG. 3 can be realized in the same way as the one according to FIG. 1, by employing the generally known silicon gate technology. In both cases, however, it would also be possible to employ the known aluminum technology, in which gate electrodes of aluminum are used.

What is claimed is:

1. A monolithic integrated reference voltage source, comprising:
   a substrate;
   a first depletion-type MOSFET formed in said substrate and having drain, source and gate electrodes, said drain electrode adapted to be connected to a supply potential, and the gate electrode adapted to be connected to a reference potential;
   a second enhancement-type MOSFET formed in said substrate and having drain, source and gate electrodes, said drain electrode being connected to the source electrode of the first MOSFET, the gate electrode being connected to the drain electrode of the second MOSFET, and the source electrode being connected to the reference potential; and
   a reference voltage output connected to the connection between the source and drain electrodes of said first and second MOSFETs, said MOSFETs having a gate oxide layer with a thickness lying in the range of between 0.060 and 0.066 microns, said substrate having a doping level below the gate of said second MOSFET within the range of 5 to $7 \cdot 10^{14}$ $cm^{-3}$, and the substrate surface below the gate of said first MOSFET having implanted donators in the range of 0.75 to $1.25 \cdot 10^{12}$ $cm^{-2}$, said MOSFETs further having conducting channels having widths W and lengths L such that the ratio of the width-to-length ratio of the first MOSFET to the width-to-length ratio of the second MOSFET lies in a range between 1.10 and 1.40.

* * * * *